(12) United States Patent
Nataraj et al.

(10) Patent No.: US 6,567,340 B1
(45) Date of Patent: May 20, 2003

(54) MEMORY STORAGE CELL BASED ARRAY OF COUNTERS

(75) Inventors: Bindiganavale S. Nataraj, Cupertino, CA (US); Varadarajan Srinivasan, Los Altos Hills, CA (US); Sandeep Khanna, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/846,513

(22) Filed: Apr. 30, 2001

Related U.S. Application Data

(63) Continuation-in-part of application No. 09/406,170, filed on Sep. 23, 1999.

(51) Int. Cl.[7] .................................................. G11C 8/00
(52) U.S. Cl. ...................................... 365/236; 365/231
(58) Field of Search ........................... 365/236, 49, 231; 395/375, 494, 800, 23; 364/551.01

(56) References Cited

U.S. PATENT DOCUMENTS

| 3,257,646 A | 6/1966 | Roth |
| 3,353,159 A | 11/1967 | Lee, III |
| 3,602,899 A | 8/1971 | Lindquist et al. |
| 3,675,211 A | 7/1972 | Raviv |
| 3,685,020 A | 8/1972 | Meade |
| 3,868,642 A | 2/1975 | Sachs |
| 4,112,502 A | 9/1978 | Scheuneman |
| 4,244,033 A | 1/1981 | Hattori |
| 4,472,805 A | 9/1984 | Wacyk et al. |
| 4,523,301 A | 6/1985 | Kadota et al. |
| 4,646,271 A | 2/1987 | Uchiyama |
| 4,656,626 A | 4/1987 | Yudichak et al. |
| 4,670,858 A | 6/1987 | Almy |
| 4,747,080 A | 5/1988 | Yamada |
| 4,758,982 A | 7/1988 | Price |
| 4,780,845 A | 10/1988 | Threewitt |
| 4,785,398 A | 11/1988 | Joyce et al. |
| 4,791,606 A | 12/1988 | Threewitt et al. |
| 4,813,002 A | 3/1989 | Joyce et al. |
| 4,845,668 A | 7/1989 | Sano et al. |
| 4,903,234 A | 2/1990 | Sakaraba et al. |
| 4,928,260 A | 5/1990 | Chuang et al. |

(List continued on next page.)

FOREIGN PATENT DOCUMENTS

| EP | 0 267 612 A2 | 5/1988 |
| EP | 0 381 249 A2 | 8/1990 |
| EP | 0 660 332 A1 | 6/1995 |
| EP | 0774758 A2 | 5/1997 |
| EP | 0 872 802 A2 | 10/1998 |
| JP | 08167295 | 6/1996 |
| WO | WO 98/12651 | 3/1998 |
| WO | WO 98/31581 | 6/1999 |

OTHER PUBLICATIONS

T.V. Lakshman and D. Stiliadis, "High–Speed Policy–Based Packet Forwarding Using Efficient Multi–dimensional Range Matching" *SIGCOMM*, 1998, pp. 203–314.

Xipeng Xiao and Lionel M. Ni, "Internet QoS: A Big Picture," *IEEE* Network, Mar./Apr. 1999, pp. 8–18.

"White Paper—Introduction to QoS Policies," Stardust-.com, 1999, pp. 1–22.

(List continued on next page.)

*Primary Examiner*—David Nelms
*Assistant Examiner*—Thinh Nguyen
(74) *Attorney, Agent, or Firm*—Blakely, Sokoloff, Taylor & Zafman LLP

(57) ABSTRACT

A multi-counter based system having a counter array. Each counter of the array having a memory cell. The system also includes an address decoder coupled to the counter array to select at least one of the memory cells within the counter array and read/write circuitry coupled to the counter array to pass data with the counter array.

56 Claims, 12 Drawing Sheets

U.S. PATENT DOCUMENTS

| | | |
|---|---|---|
| 4,958,377 A | 9/1990 | Takahashi |
| 4,959,811 A | 9/1990 | Szczepanek |
| 4,975,873 A | 12/1990 | Nakabayashi et al. |
| 4,996,666 A * | 2/1991 | Duluk, Jr. .................... 365/49 |
| 5,010,516 A | 4/1991 | Oates |
| 5,014,195 A | 5/1991 | Farrell et al. |
| 5,036,486 A | 7/1991 | Noguchi et al. |
| 5,051,948 A | 9/1991 | Watabe et al. |
| 5,053,991 A | 10/1991 | Burrows |
| 5,072,422 A | 12/1991 | Rachels |
| 5,107,501 A | 4/1992 | Zorian |
| 5,111,427 A | 5/1992 | Kobayashi et al. |
| 5,226,005 A * | 7/1993 | Lee et al. ..................... 365/49 |
| 5,239,642 A | 8/1993 | Gutierrez et al. |
| 5,265,100 A | 11/1993 | McClure et al. |
| 5,319,763 A | 6/1994 | Ho et al. |
| 5,339,268 A * | 8/1994 | Machida ..................... 365/49 |
| 5,383,146 A | 1/1995 | Threewitt |
| 5,414,704 A | 5/1995 | Spinney |
| 5,422,838 A | 6/1995 | Lin |
| 5,440,709 A | 8/1995 | Edgar |
| 5,454,094 A | 9/1995 | Montove |
| 5,455,576 A | 10/1995 | Clark, II et al. |
| 5,465,335 A * | 11/1995 | Anderson ................... 395/375 |
| 5,467,319 A * | 11/1995 | Nusinov et al. ............. 365/231 |
| 5,469,161 A | 11/1995 | Bezek |
| 5,475,825 A | 12/1995 | Yonezawa et al. |
| 5,485,418 A | 1/1996 | Hiraki et al. |
| 5,490,102 A | 2/1996 | Jurbran |
| 5,491,703 A | 2/1996 | Barnaby et al. |
| 5,513,134 A | 4/1996 | Cooperman et al. |
| 5,517,441 A | 5/1996 | Dietz et al. |
| 5,615,135 A * | 3/1997 | Waclawsky et al. ... 364/551.01 |
| 5,619,676 A * | 4/1997 | Fukuda et al. .............. 395/464 |
| 5,621,677 A | 4/1997 | Jones |
| 5,642,322 A | 6/1997 | Yoneda |
| 5,649,149 A | 7/1997 | Stormon et al. |
| 5,706,224 A | 1/1998 | Srinivasan et al. |
| 5,740,098 A * | 4/1998 | Adams et al. ................ 365/49 |
| 5,745,488 A | 4/1998 | Thompson et al. |
| 5,752,069 A * | 5/1998 | Roberts et al. ......... 395/800.23 |
| 5,818,786 A | 10/1998 | Yoneda |
| 5,818,873 A | 10/1998 | Wall et al. |
| 5,841,874 A | 11/1998 | Kempke et al. |
| 5,860,085 A | 1/1999 | Stormon et al. |
| 5,870,324 A | 2/1999 | Helwig |
| 5,893,931 A | 4/1999 | Peng et al. |
| 5,920,886 A | 7/1999 | Feldmeier |
| 5,930,359 A | 7/1999 | Kempke et al. |
| 5,946,704 A | 8/1999 | Yoneda et al. |
| 5,949,696 A | 9/1999 | Threewitt |
| 6,000,008 A | 12/1999 | Simcoe |
| 6,006,306 A | 12/1999 | Haywood et al. |
| 6,011,795 A | 1/2000 | Varghese et al. |
| 6,065,064 A | 5/2000 | Satoh et al. |
| 6,081,440 A | 6/2000 | Washburn et al. |

OTHER PUBLICATIONS

"Policy–Based Routing," Cisco Systems, Inc., 1996, 1–7.

Music Semiconductors, MU9C2480 LANCAM, Preliminary Data Sheet, Aug. 25, 1995, pp. 1–24.

Music Semiconductors, MU9C2480 LANCAM, Handbook, Nov. 1994.

Music Semiconductors, "MU9C1480 LANCAM" Advance Information, Mar. 22, 1990, pp. 1–11.

Music Semiconductors, "MUAA™ CAM Family" Advanced Information, Feb. 24, 1998, Rev. 0, pp. 1–16.

Takeshi Ogura et al., "A 4kbit Associative Memory LSI", IEEE Journal of Solid–State Circuit, vol. SC–20, No. 6, Dec. 1985, pp. 1277–1281.

Hiroshi Kadota et al., "An 8kbit Content–Addressable and Reentrant Memory", IEEE Journal of Solid–State Circuits, vol. SC–20, No. 5, Oct. 1985, pp. 951–956.

Simon R. Jones et al., "A 9–kbit Associative Memory for High Speed Parallel Processing Applications", IEEE Journal of Solid–State Circuits, vol. 23, No. 2, Apr. 1988 pp. 543–548.

Landrock et al., "Associative Storage Module", IBM Technical Disclosure Bulletin, vol. 25, No. 5, Oct. 1992, pp. 2341–2342.

KLSI DE5B064A1 Address Processor Ver. 2.0.2 Preliminary (believed to be published late 1995 or early 1996).

KLSI KE5B064H Series Address Processor Ver. 1.0.1 (believed to be published in late 1995 or early 1996).

Pankaj Gupta and Nick McKeown, "Packet Classification on Multiple Fields," SIGCOMM (Sep. 2, 1999), 14 pages.

V. Srinivasan, et al., "Packet Classificatin using Tuple Space Search," SIGCOMM (Sep. 2, 1999), 12 pages.

Soo–ik Chae et al., "Content–Addressable Memory for VLSI Pattern Inspection", IEEE Journal of Solid State Circuits, vol. 23, No. 1, Feb. 1988, pp. 74–78.

Yong–Chui Shin et al., "A Special–Purpose Content Addressable Memory Chip for Real–Time Image Processing", IEEE Journal of Solid–State Circuits, vol. 27, No. 5, May 1992, pp. 737–744.

Sergio R. Ramirez–Chavez, "Encoding Don't Cares in Static and Dynamic Content–Addressable Memories", Transaction Briefs, IEEE Transactions on Circuits and System–II: Analog and Digital Signal Processing, vol. 39, No. 8, Aug. 1992, pp. 575–578.

Keikichi Tamaru, "The Trend of Functional Memory Development", Invited Paper Special Issue on LSI Memories, IEICE Trans. Electron, vol. E76–C, No. 11, Nov. 1993, pp. 1545–1554.

Music Semiconductors, Advance Information "MUAA Routing CoProcessor (RCP) Family," (Oct. 1, 1998), Rev. 1b, pp. 1–16.

Kanad Ghose, "Response Pipelined Cam Chips: The Fast Generation and Beyond." $7^{th}$ International Conference on VLSI Design, Jan. 1994, pp. 365–368.

Anthony McAuley et al., A Self–Testing Reconfigurable CAM," IEEE Journal of Solid–State Circuits, vol. 26, No. 3, Mar. 1991 pp. 257–261.

Ian N. Robinson, "Pattern Addressable Memory," IEEE Micro, Jun. 1992, pp. 20–30.

Motorola Semiconductor Technical Data, "Advanced Information 16K×64 CAM", MCM69C432, Jan. 1996, pp. 4 pages.

Advanced Micro Devices, "Final Am99C10A 256×48 Content Addressable Memory" Publication No. 08125, Rev. G. Dec. 1992, pp. 1–21.

Masao Akata, "A Scheduling Content–Addressable Memory for ATM Space–Division Switch Control", IEEE International Solid–State Circuits Conference, Feb. 1991, New York.

Pankaj Gupta et al., "Routing Lookups in Hardware at Memory Access Speeds", Proc. Infocom, Apr. 1998, 8 pgs.

Masayoshi Kobayashi et al., "A 50Mpps Longest Prefix Match Search Engine LSI for Multi–gigabit IP Forwarding", Technical Report of IEICE IN08–119, Nov. 1998, pp. 7–12.

GEC Plessey Semiconductors, "P2800 2K×64 Bit Multi–Port Content Addressable Memory," Preliminary Information, Feb. 1997, pp. 1–15.

GEC Plessey Semiconductors, "2800 Multi–port Content Addressable Memory," Functional Product Specification GPS–FPS–2800–12, Jan. 1996.

Patent Abstracts of Japan, Publication No. 08273376, Publication date Oct. 18, 1996.

"SRAM–Based Counters", IBM Technical Disclosure Bulletin, vol. 34, No. 12, May 1992, pp. 269–275.

* cited by examiner

| | CLK | B | A | |
|---|---|---|---|---|
| 610 — | (PRELOAD) | 0 | 0 | (1 1) |
| 620 — | 0 | 0 | 0 | |
| 630 — | ⌐ | 0 | 1 | |
| 640 — | ⌐ | 1 | 0 | |
| 650 — | ⌐ | 1 | 1 | |

FIG. 6

FIG. 8  UP/DOWN COUNTER

US 6,567,340 B1

MEMORY STORAGE CELL BASED ARRAY OF COUNTERS

REFERENCE TO RELATED APPLICATION

This application is a continuation-in-part and claims priority to U.S. application Ser. No. 09/406,170, filed Sep. 23, 1999.

FIELD OF THE INVENTION

This invention relates to the field of digital integrated circuits and, in particular, to counters.

BACKGROUND OF THE INVENTION

A counter is a digital circuit that can count in discrete increments based on data input to the counter. A counter may be constructed from an array of flip-flops in which the flip-flops are interconnected in such a manner that the array advances from state to state with each cycle of a input waveform, such as a clock signal. A counter starts from some initial state, advances through other possible states, and then may return to the initial state. Counters may be designed using different types of flip-flops.

A flip-flop, in essence, is a logic circuit that has a memory. That is, given the present logic levels at its inputs, it is possible from an examination of the output to determine what the logic levels were at the inputs immediately before they attained the present levels. A clocked flip-flop is one that can change state only when a clock input signal transitions states, no matter how many changes occur at the inputs. As such, the output is held constant while some of the inputs may be changing.

FIG. 1A illustrates a particular type of counter, known as a ripple counter. The ripple counter is designed with a particular type of clocked flip-flop, known as a D-type flip-flop. D, or data, flip-flops have only a single data input (as opposed to two inputs as with other types of flip-flops) and a clock input. Regardless of the input level, the D input is transferred to the output with the next state of the output given by the current value of the input. D flip-flops use combinational logic circuits (e.g., NAND gates, NOR gates) to perform this function. By connecting D flip-flops in the illustrated manner, a ripple counter may be formed.

The ripple counter has outputs of a preceding flip-flop fed to the clock input of a subsequent flip-flop in the chain. In this manner, each flip-flop changes state only when a preceding flip-flop changes logic states. The flip-flops toggle on the positive transitions (low-to-high) of the waveform at the clock input. The ripple counter generates a 3-bit (b0, b1, b2) binary count on the outputs (Q) of the flip-flops that cycles from 000 through 111 and back to 000. The ripple counter is asynchronous, since counts occur in a subsequent flip-flop only after data output from a preceding flip-flop has a positive state transition. This is in contrast to a synchronous counter where the clock input feeds into all three flip-flop simultaneous so that the outputs of all the flops change at the same time.

The ripple counter of FIG. 1A is an up-counter that counts in a direction of increasing binary numbers. Other types of counters include down-counters that counts in a direction of decreasing binary numbers and up-down counters that either add to, ignore, or subtract from the current count at any time.

The D flip-flops of the ripple counter of FIG. 1A may be designed with latches configured in a master-slave relationship, as illustrated in FIG. 1B. A latch is a form of flip-flop that has the ability to remember a previous input and store it until the latch is overwritten or cleared. Two individually clocked latches, a master and a slave, may be used. The clock (CLK) signal is applied to the master latch, but the clock complement ($\overline{CLK}$) is applied to the slave latch. The slave latch provides the output signal and the master latch provides storage for the input data. Because of this storage, input data is available to the slave when the clock is at the level at which the input is disabled. The D flip-flop may also be designed with set and reset functions, as illustrated in FIG. 1C.

One problem with prior flip-flops that use conventional logic circuitry for data storage such as formed by the cross-coupled NOR gates of FIG. 1C is that the NOR gates are typically unbalanced to allow for setting and resetting of the storage nodes. Such unbalancing may undesirably increase the size of the flip-flop and, thereby, the size of ripple counters formed with such flip-flops. Another disadvantage of the flip-flop of FIG. 1C is that it is typically fabricated using CMOS transmission gates. This also may undesirably increase the size of the flip-flop and the size of a ripple counter formed with such flip-flops.

The ripple counters of FIG. 1A may be combined together to form an array of counters. FIG. 2 illustrates a conventional structure for a counter array. For example, a counter array may have N counters with each counter having k output bit lines. An additional k-bit counter may be coupled to the inputs of the N counters to pre-load the counters. In order to select among the outputs of the N counters in the array, an N, k-bit to 1, k-bit multiplexer may be coupled to the array. A multitude of select signals may be generated, for example, by circuitry that enables one of the counter outputs to be output from the multiplexer. One problem with the array structure illustrated in FIG. 2 is that it requires significant area for the circuitry and routing necessary to access each counter's count to perform load, reset, increment, and decrement functions.

SUMMARY OF THE INVENTION

The present invention pertains to an array of counters having memory cells. In one embodiment, the apparatus includes a counter array having a plurality of counters, each counter having a memory cell. The apparatus may also include an address decoder coupled to the counter array to select at least one of the memory cells within the counter array and read/write circuitry coupled to the counter array to pass data with the counter array.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings.

FIG. 6 illustrates a state table for the up-counter of FIG. 5.

DETAILED DESCRIPTION

In the following description, numerous specific details are set forth such as examples of specific, components, circuits, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

The method and apparatus described herein may be used to form an array of counters using memory cell access techniques and architectures. In one embodiment, the method may include using conventional memory cell architectures (e.g., bit and word lines) to access counters, and counter bits, within the counter array. The above scheme allows for many (e.g., hundreds, thousands, hundreds of thousands, etc.) counters to be implemented within an array and accessed (e.g., read, write, set, reset) in an efficient manner without the need to multiplex access to or from the counters within the array.

Figure 3:
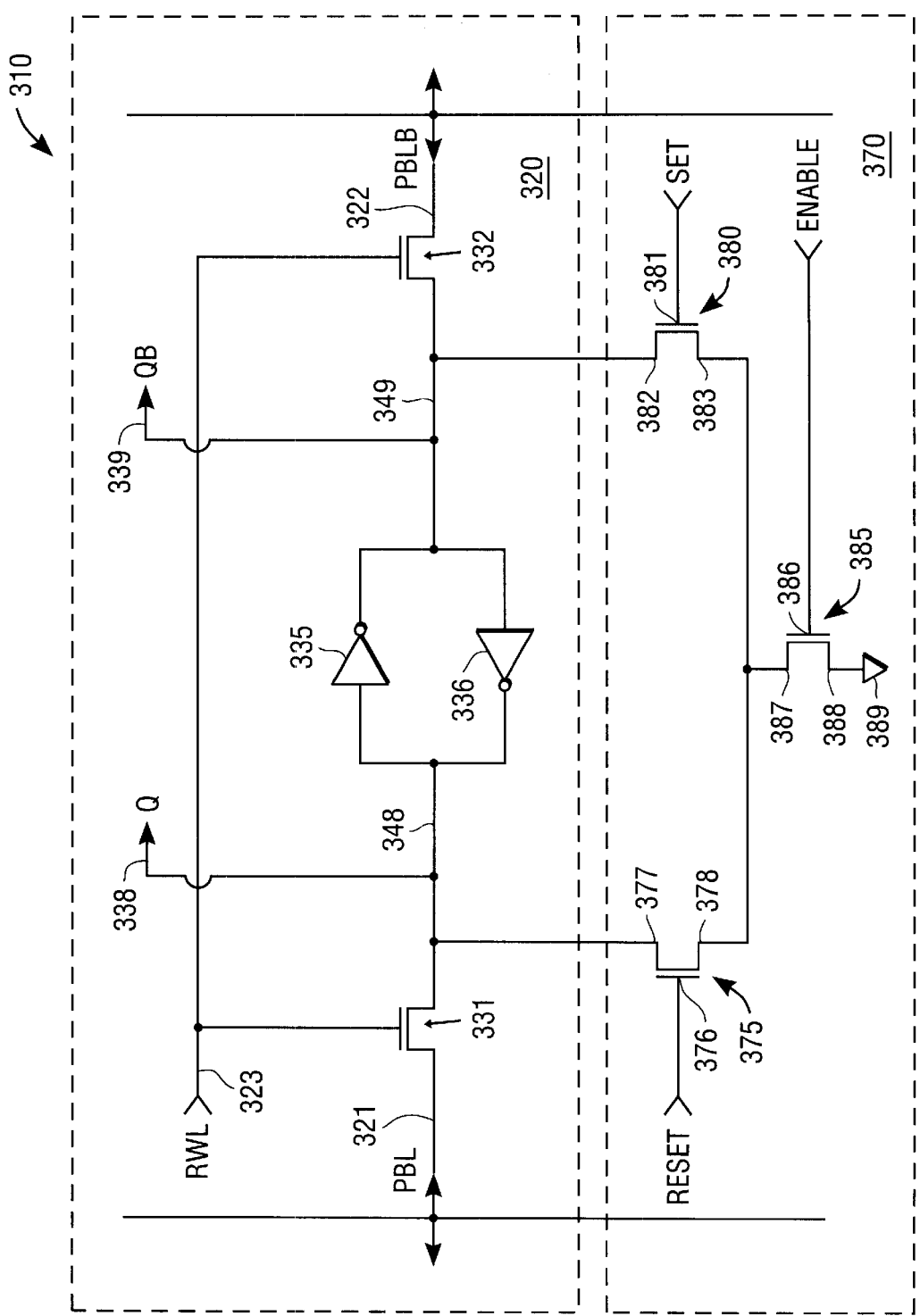
FIG. 3 illustrates one embodiment of a latch having memory storage cells.

FIG. 3 illustrates one embodiment of a latch having memory cells that may be used within a counter array. Latch 310 includes a memory cell 320 and a control logic circuit 370 coupled to memory storage cell 320. Memory cell 320 may be used to store a data value while control logic circuit 370 may be used to set and reset memory storage cell 320. Together memory cell, 320 and control logic circuit 370 operate as a latch to store set or programmed data until it is reset to a predetermined state.

In one embodiment, memory cell 320 may be a static random access memory (SRAM) cell. SRAM cell 320 includes word line (RWL) 323, bit line 321, complementary data bit line (PBLB) 322, output (Q) 338, and complementary output (QB) 339. Word line 323 may be coupled to other cells in an array, as discussed in further detail below with respect to FIG. 4. Data is stored at storage nodes 348 and 349 in the form of voltage levels maintained by cross-coupled inverters 335 and 336. The cross-coupled inverters 335 and 336 have two stable states which are designated as high "1" and low "0". Both states are stable as long as a power is applied to the circuit without the need to refresh the cell to retain data. Any transistor configuration may be used to implement the cross-coupled inverters 335 and 336.

Figure 1A:
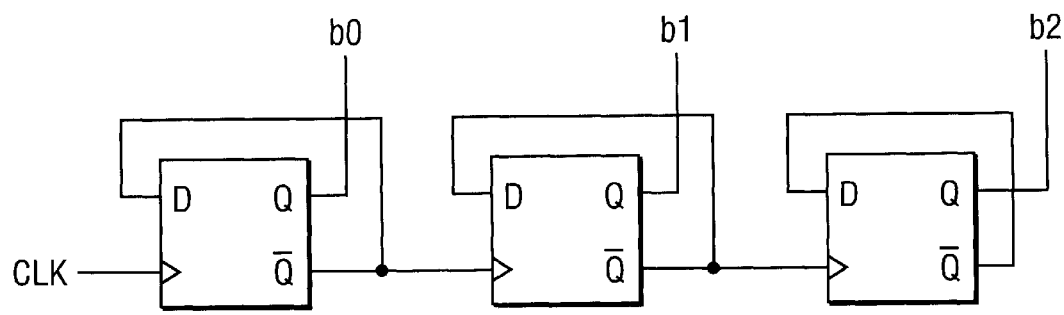
FIG. 1A illustrates a o art ripple counter.
Figure 1B:
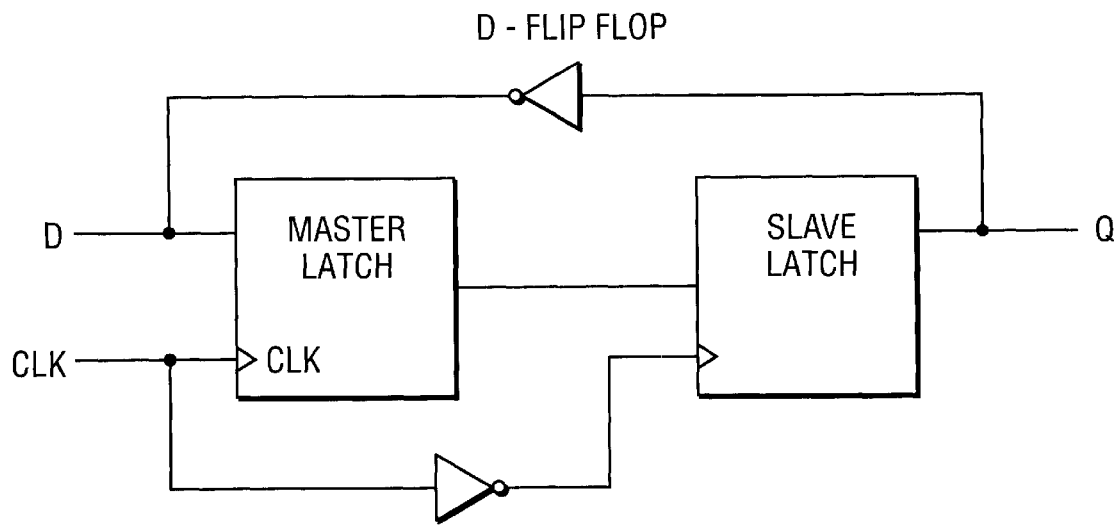
FIG. 1B illustrates a prior art D type flip-flop.
Figure 1C:
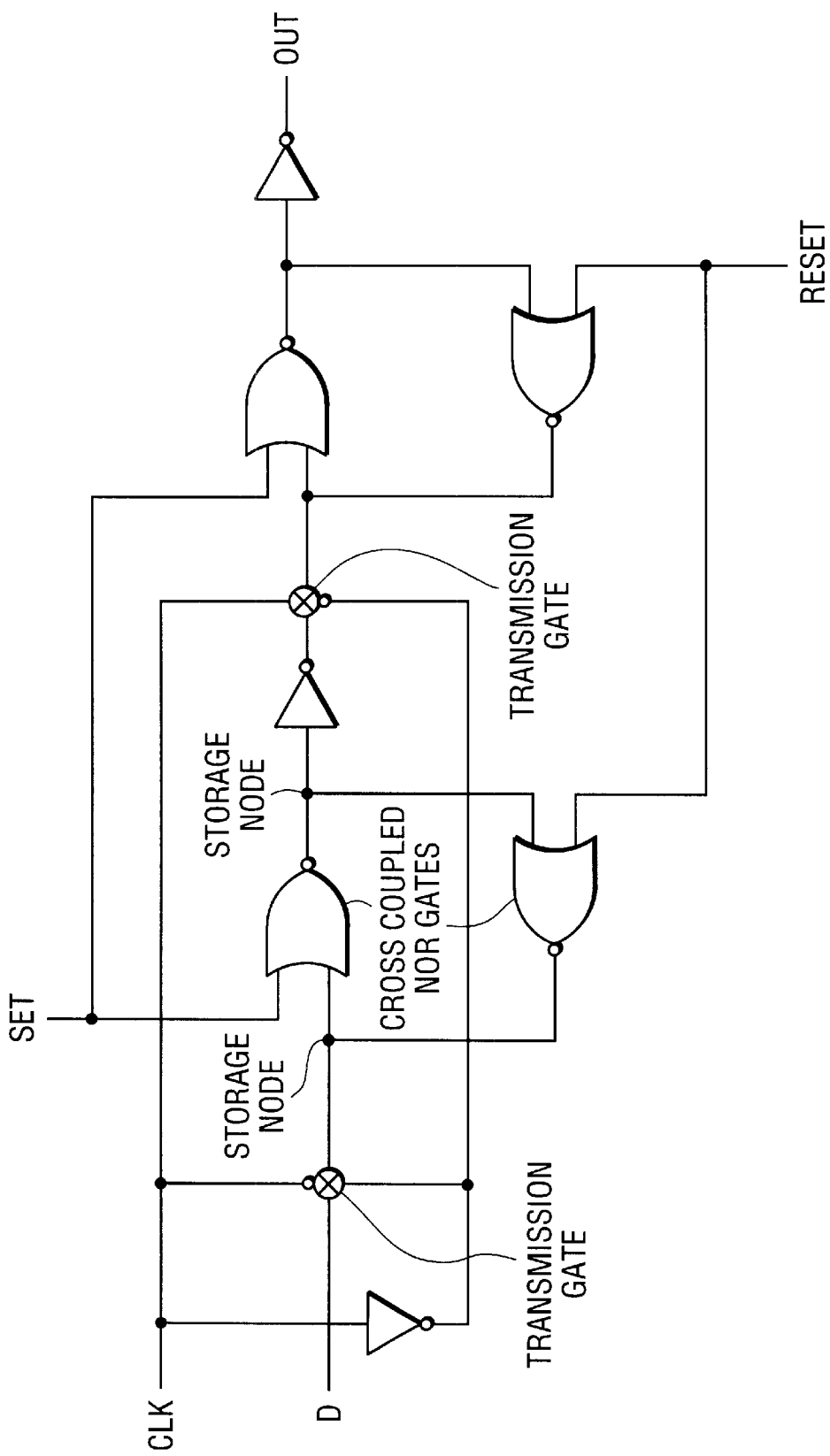
FIG. 1C illustrates another prior art D type flip-flop with set and reset functions.

Transistors 331 and 332 are pass gates that are coupled to storage nodes 348 and 349, respectively, and thereby inverters 335 and 336 in order to read and write data to the cell. When transistors 331 and 332 are turned on, storage nodes 348 and 349 have the same state as bit lines 321 and 322, respectively. In one embodiment, transistors 331 and 332 are N type Metal-Oxide-Semiconductor (NMOS) transistors. These pass gates may be formed more compactly than the CMOS transmission gates of FIG. 1C, thus saving circuit die area. Alternatively, other types or combinations of transistors may be used, for examples, PMOS, CMOS, and bipolar transistors.

In general to write data to the cell, data is placed on PBL 321 (complementary data on PBLB 322) while word line 323 is activated to turn on transistors 331 and 332 to allow the data to be passed to storage nodes 348 and 349, and maintained by cross-coupled inverters 335 and 336. To read data, PBL 321 and PBLB 322 are brought high and word line 323 is selected. This causes one of the bit lines 321 and 322 to transition low relative to the other bit line and create a differential signal that may be detected by a sense amplifier coupled to it (not shown), as discussed below in relation to FIG. 9.

Advantageously, SRAM cell 320 may have cross-coupled inverters 335 and 336 balanced in size and strength. This enables cross-coupled inverters 335 and 336 to be densely fabricated and, generally, be fabricated in less area (e.g., less silicon area) than using unbalanced cross-coupled logic and transistors.

It should be noted that the circuit configuration for SRAM cell 320 is only exemplary. In alternative embodiments, SRAM cell 320 may have other circuit configurations. Although illustrated with MOS transistors, memory cell 320 may be designed with other types of process technologies, for examples, Bipolar and BiCMOS. In an alternative embodiment, memory cell 320 may be another type of volatile or non-volatile memory storage cell such as a dynamic random access memory (DRAM) or read only memory (ROM) cell. Memory cells are known in the art; accordingly, a more detailed discussion is not provided.

In one embodiment logic circuit 370 may include three transistors 375, 380, and 385 that operate to set and reset the SRAM storage cell. Transistor 375 has gate terminal 376 configured to receive a reset signal, channel terminal 377 coupled to storage node 348, and channel terminal 378 coupled to transistor 385. Transistor 380 has a gate terminal 381 configured to receive a set signal, channel terminal 382 coupled to storage node 349, and channel terminal 383 coupled to transistor 385. Transistor 385 has a gate terminal 386 configured to receive an enable signal (e.g., a clock signal), channel terminal 387 coupled to transistors 375 and 380, and channel terminal 388 coupled to ground. Transistor 385 is used to provide a discharge path towards ground potential 389 for transistors 375 and 380 and, thereby, enable the setting and resetting of cell 320 based on an enable signal received at gate terminal 386. In an alternative embodiment, other circuit configurations for control logic circuit 370 to enable the setting and resetting of storage cell 320 nodes 348 and 349.

In one embodiment, transistors 375, 380, and 385 may be N type Metal-Oxide-Semiconductor (NMOS) transistors. Alternatively, other types of transistors may be used, for examples, PMOS, CMOS and bipolar transistors.

Figure 4:
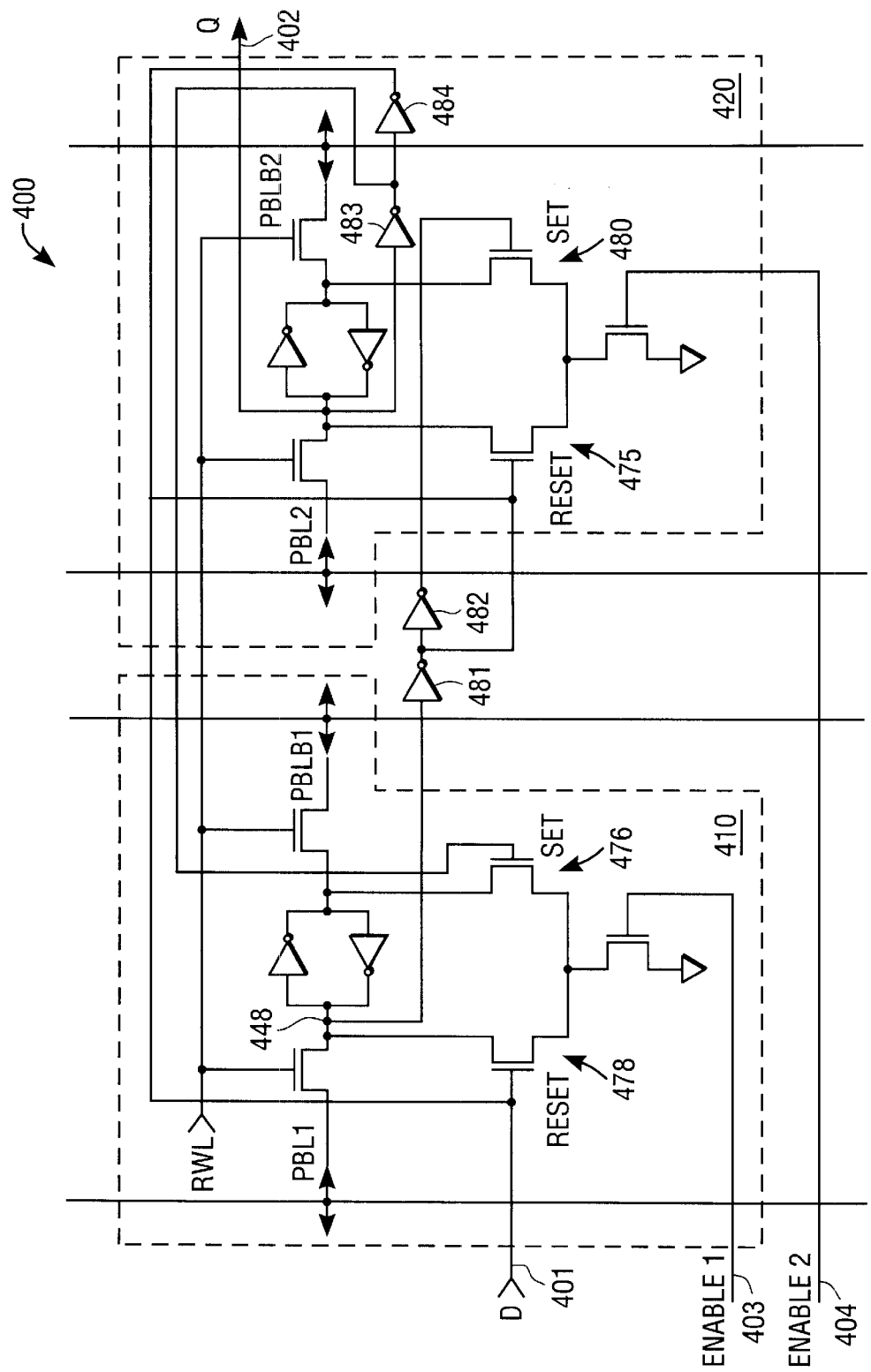
FIG. 4 illustrates one embodiment of a flip-flop having latches that include memory storage cells.

FIG. 4 illustrates one embodiment of a flip-flop having latches that include memory storage cells. Two or more of the latches 310 of FIG. 3 may be coupled together to form a flip-flop. In one embodiment, for example, two latches 410 and 420 may be coupled together to form a D-type flip-flop 400. Each of latches 410 and 420 include a memory storage cell. Each of latches 410 and 420 operate in a manner similar to latch 310 discussed above in relation to FIG. 3. Each of the memory storage cells may be part of an array as discussed below in relation to FIG. 9.

Flip-flop 400 includes a data input (D) 401, a data output (Q) 402, and enable inputs 403 and 404. Latch 410 may be configured as a master latch that provides storage for the input data at input 401, and latch 420 may be configured as a slave latch to provide output data on output Q 402. A clock (CLK) signal may be applied to the enable input 403 of master latch 410, with a clock complement ($\overline{CLK}$) signal may be applied to the enable input 404 of slave latch 420. The storage node 448 of master latch 410 is coupled to reset transistor 475 through inverter 481 and to set transistor 480 through inverters 481 and 482. The data output 402 of the flop (also a storage node of slave latch 420) is coupled to the set transistor 476 of master latch 410 through inverter 483 and the reset transistor 478 through inverters 483 and 484. In this manner, regardless of the input level, the data on D input 401 is transferred to Q output 402 with the next state of the output given by the current value of the input. In an alternative embodiment, other types of flops may be formed using latches 310 of FIG. 3. For other embodiments, one or more of inverters 481–484 may be omitted and the signals output by each inverter directly provided from the storage nodes of the appropriate storage node.

Two or more of flip-flops 400 of FIG. 4 may be coupled together to form various types of counters, for examples, an up-counter, a down-counter, and an up/down counter, as discussed below.

Figure 5:
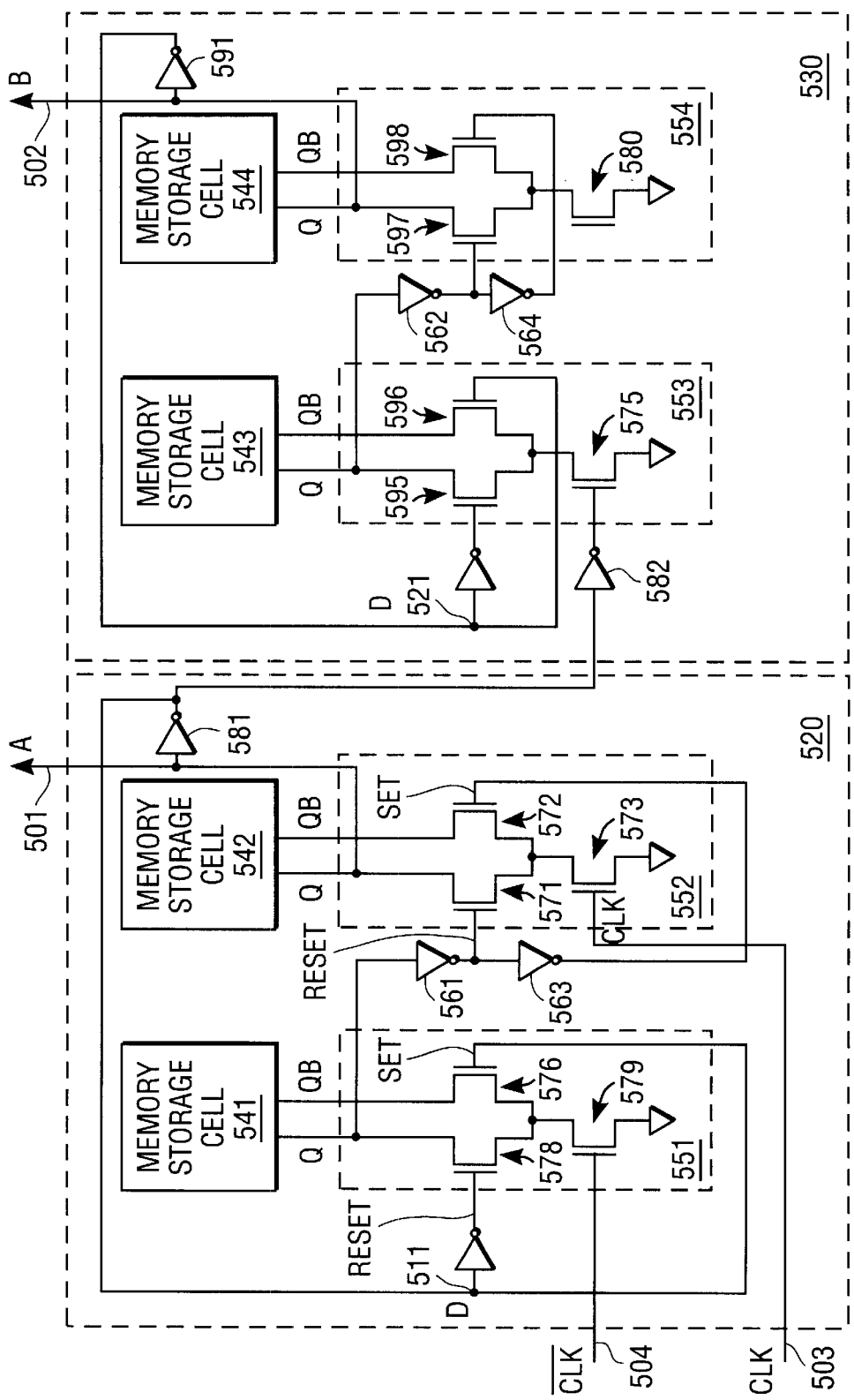
FIG. 5 illustrates one embodiment of an up-counter.

FIG. 5 illustrates one embodiment of an up-counter. Counter 500 includes flip-flops 520 and 530 that are coupled together to form an up-counter. Flip-flop 530 may operate in a manner similar to flip-flop 400 discussed above in relation to FIG. 4. Flip-flop 520 is similar to flip-flop 400 with the addition of an inverter 582 coupled to the gate of the enable transistor in 575 in the master latch. Flip-flops 520 and 530 include memory storage cells 541–544 that may be part of an array as discussed below in relation to FIG. 9. Memory storage cells 541–544 operate in a manner similar to memory storage cell 320 of FIG. 3; however, the word line and bit lines are not shown for ease of illustration. Memory storage cells 541–544 are coupled to control logic circuits 51–554, respectively. Control logic circuits 551–554 operate in a manner similar to control logic circuit 370 of FIG. 3.

Counter 500 includes an enable (CLK) input 503 configured to receive a clock signal and enable input 504 configured to receive a complement ($\overline{CLK}$) of the clock signal applied to input 503. Counter 500 generates a 2-bit binary count on the outputs A 501 and output B 502 of flip-flops 520 and 530, respectively, that cycles from 00 through 11 and back to 00 in response to a received clock signal. Counter 500 is asynchronous, as counts occur in flip-flop 530 only after the data stored in flip-flop 520 has a positive state transition. Ripple counter 500 is an up-counter that counts in a direction of increasing binary numbers. A state table of outputs A and B relative to an applied clock signal is illustrated in FIG. 6.

In one embodiment, the memory storage cells 541–555 of counter 500 may be pre-loaded to have a 00 on outputs B and A, state 610. Alternatively, memory storage cells 541–555 of counter 500 may be pre-loaded such that outputs B and A have another state, such as 11 state 610. In one embodiment, flip-flops 520 and 530 toggle on the positive transition (low-to-high, or rising edge) of the clock signal waveform at enable input 503. On the falling edge, the reset and set transistors of control logic circuits 551–554 setup for the next state of the flops, but the output A 501 and output B 502 do not toggle.

With memory storage cells 541–555 pre-loaded to have 0 outputs, the gate of reset transistor 578 is at a 0 logic state and the gate of set transistor 576 is at a 1 logic state. When ($\overline{CLK}$) 504 transitions to a 1 (and CLK goes to a 0), control logic circuits 551 and 552 set up for the next state by using set transistor 576 and enabling the output of memory storage cell 541 to a 1 without toggling the output of memory storage cell 542. Because output A 501 is coupled to enable transistor 575 through inverters 581 and 582, the gate of enable transistor 575 remains at a 0 and, thereby, the output of memory storage cell 543 remains at 0. Correspondingly, the output B 502 also remains at 0, state 620. Because output A 501 is coupled to set transistor 576 through inverter 581, the gate terminal of set transistor 576 is at a 1 state.

On the next positive transition of the clock signal (CLK), state 630, ($\overline{CLK}$) 504 goes to a 0. This enables reset transistor 578 and enable transistor 573 to reset the output of memory storage cell 541 from a 1 to a 0 and set transistor 572 and enable transistor 579 to set output A 501 from a 0 to a 1. The 1 on output A 501 toggles the gate of enable transistor 575 to a 1 and the gate of transistor 580 to a 0. This enables set transistor 596 and enable transistor 575 to set the output of memory storage cell 543 to a 1.

It will be understood by one skilled in the art that on subsequent positive transitions of the clock signal, output A 501 toggles or is reset to a 0 while output B 502 toggles or is set to a 1, state 640; then output A 501 toggles or is set to a 1 while output B remains at a 1, state 650; and then the counter cycles back to 00.

Ripple counters having additional bits may be formed using additional flip-flops by coupling the outputs of a preceding flip-flop to the enable input of a subsequent flip-flop in the chain. In this manner, each flip-flop changes state only after the preceding flip-flop changes logic states.

Figure 7:
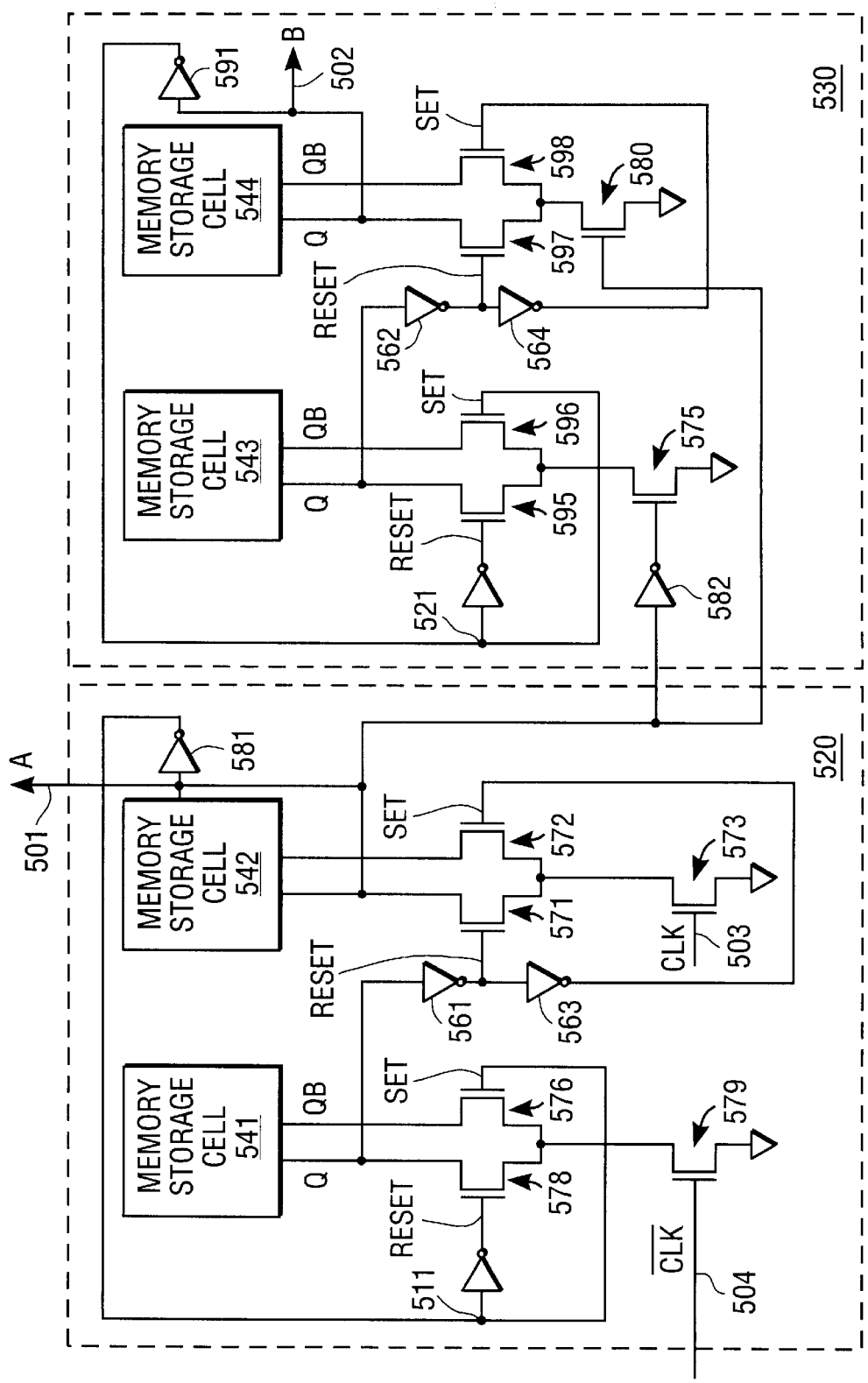
FIG. 7 illustrates one embodiment of a down-counter.

FIG. 7 illustrates one embodiment of a down-counter. The down counter 700 is configured similar to up-counter 500 of FIG. 5 with the modification that the output of the memory storage cell 542 in the slave latch of a preceding flip-flop (e.g., flip-flop 520) is coupled directly to the enable inputs of a subsequent flip-flop (e.g., flip-flop 530) without passing through the feedback inverter 581. With this configuration, the B output 502 and A output 501 of down-counter may decrement down from 11 through 00 and back to 11 in response to a received clock signal.

Figure 8:
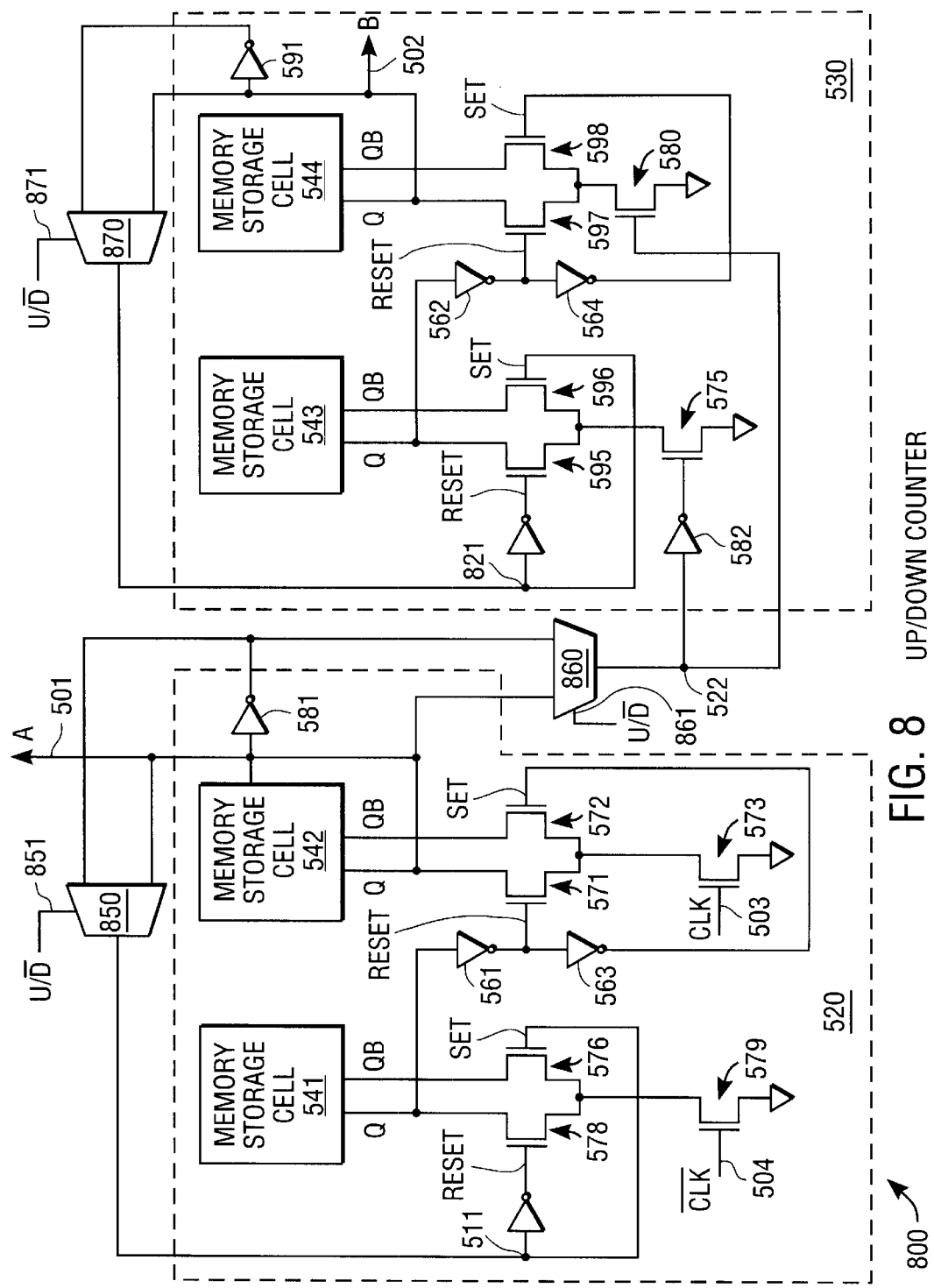
FIG. 8 illustrates one embodiment of an up/down-counter.

FIG. 8 illustrates one embodiment of an up/down-counter. The up/down counter 800 includes flip-flops 520 and 530 of FIG. 5 and multiplexers 850, 860, and 870 that operate to select between the configuration of up-counter 500 of FIG. 5 and down-counter 700 of FIG. 7. Multiplexers 850 and 860 each have a data input coupled to the output A 501 of flip-flop 520 (down-counter configuration) and another data input coupled to the output of inverter 581 (up-counter configuration). Similarly, multiplexer 870 has a data input coupled to output B 502 of flip-flop 530 and another data input coupled to the output of inverter 591. The outputs of multiplexers 850 and 860 are coupled to the D inputs 511 of flip-flop 520 and 521 of flip-flop 530, respectively. The output of multiplexer 860 is coupled to the enable inputs 822 of flip-flop 530.

Each of multiplexers 850, 860, and 870 has a control input (851, 861, and 871, respectively) to receive a control signal that selects between the up and down configurations. In one embodiment, when a high logic level is applied to control inputs 851, 861, and 871, each of multiplexers 850, 860, and 870 selects the data input for the up configuration. When a low logic level is applied to control inputs 851, 861, and 871, each of multiplexers 850, 860, and 870 selects the data input for the down configuration.

For a given mode of operation (e.g., up-counter, down-counter), flip-flops 520 and 530 are balanced given that the output A 501 of flip-flop 520 is used as a clock input to flip-flop 530. If the states of flip-flops 520 and 530 are suddenly changed to switch the mode of operation, the initial states of the components within the flops may not be proper for the newly selected mode of operation. For example, if the counter is currently configured for an up mode of operation, on a negative clock transition, the control logic circuits may have already received inputs for the next up-state of the flops. If counter 800 were then changed to a down mode operation, the control logic circuit components may not have the appropriate inputs necessary for a down count.

As such, multiplexers 850 and 870 may be switched one clock cycle before multiplexer 860 in order to pre-load the control logic circuit inputs with the appropriate inputs before flip-flop 530 is clocked with the output of flip-flop 520. In this manner, counter 800 may be configured to operate as both an up-counter and a down-counter as discussed above in relation to FIGS. 5–7.

In alternative embodiments, one or more of inverters 561, 562, 563, 564, 581, and 591 of FIGS. 5–8 may be omitted and the signals output by each inverter directly provided from the storage node of the appropriate memory cell.

Figure 2:
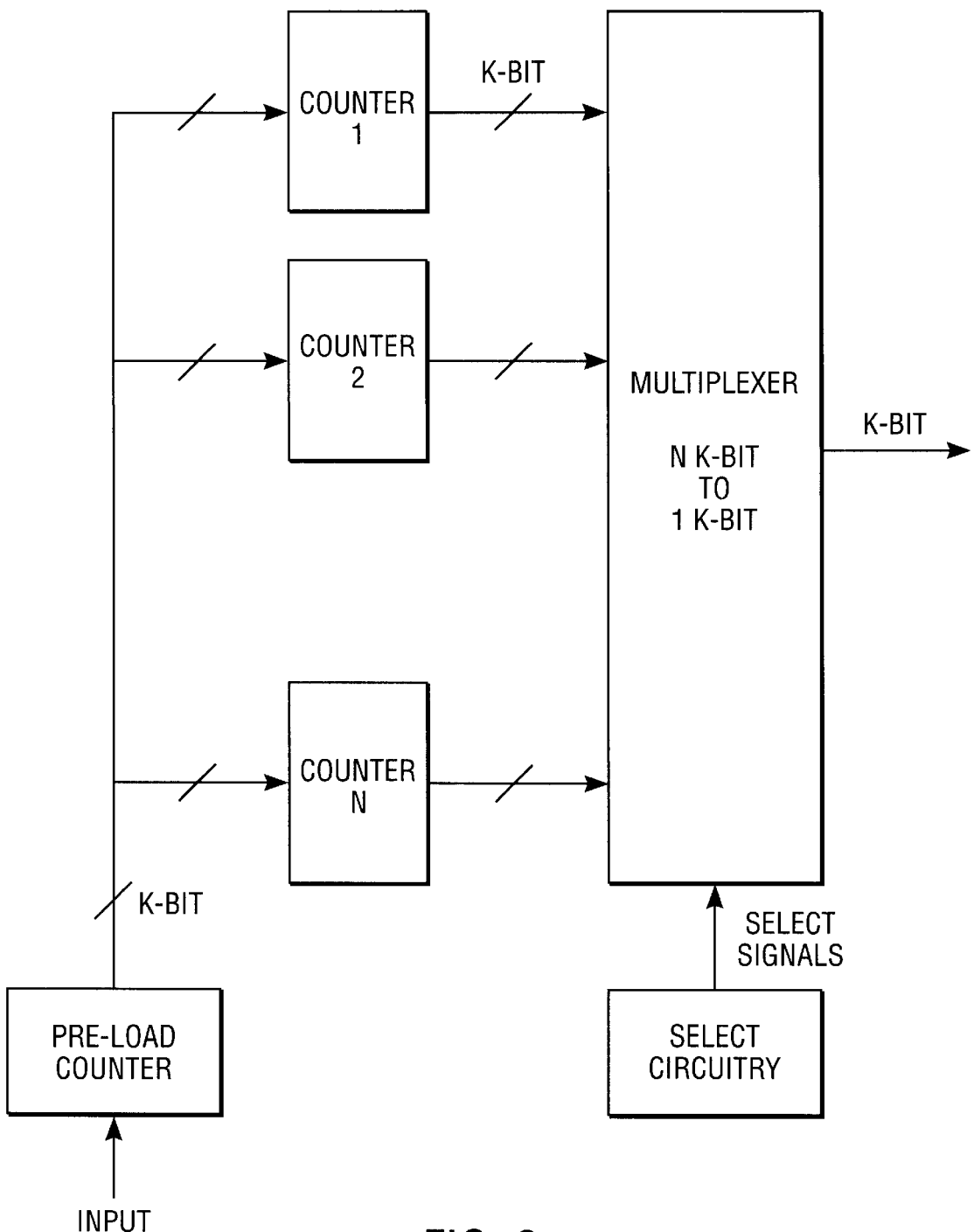
FIG. 2 illustrates a prior art structure for a counter array.
Figure 9:
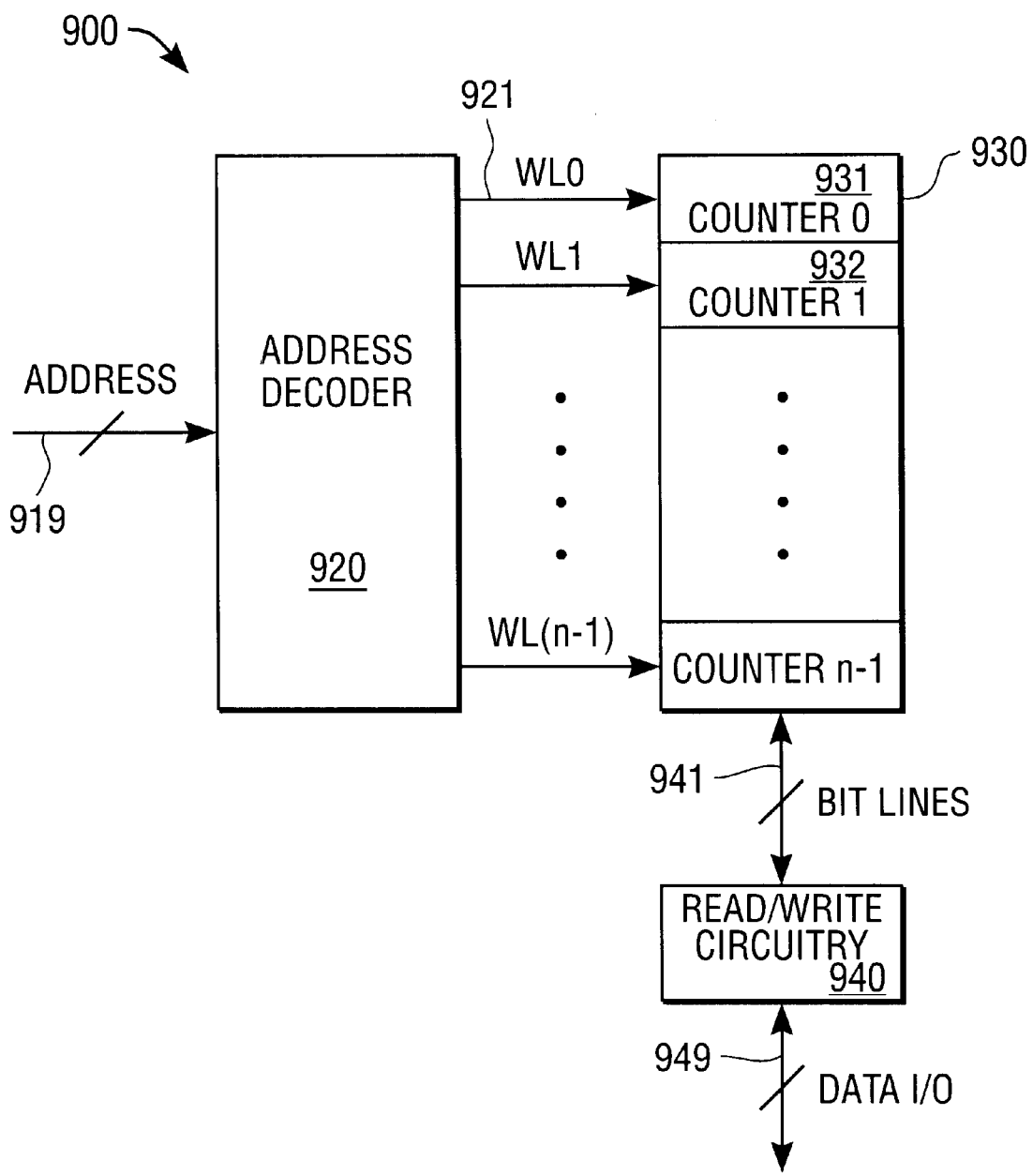
FIG. 9 illustrates one embodiment of a multi-counter based system.

FIG. 9 illustrates one embodiment of a multi-counter based system. Multi-counter based system 900 includes a counter array 930. The counters discussed above may be combined together to form counter array 930. Counter array 930 includes multiple counters (e.g., counters 931 and 932) with each counter having memory storage cells accessed using conventional memory cell access techniques. Each counter in array 930 may be similar to one of the counters discussed above in relation to FIGS. 3–8, with a memory storage cell within a counter (e.g., counter 931) being a volatile or non-volatile memory such as a SRAM or ROM cell, as discussed above in relation to FIG. 2.

Multi-counter based system 900 also includes address decoder 920 and read/write (R/W) circuitry 940. Address decoder 920 operates to provide access to one or more particular memory cells of one or more selected counters in counter array 930. For example, address decoder 920 decodes an address (e.g., a row and/or column address) provided on address inputs 919, and activates a word line (WL), such as word line 921, to select a counter, such as counter 931.

Word lines WL0-WL(n−1) may be RWL shown in FIGS. 3 and 4. All of the memory storage cells within a counter coupled to the activated bit line may be selected. Data may then be written to or read from one or more of the selected memory cells of a selected counter over bit lines 941 (e.g., bit lines PBL and PBLB of FIGS. 3 and 4, via R/W circuitry 940).

R/W circuitry 940 includes sense amplifiers, input and output buffers, and control circuits to pass data with the memory storage cells in array 930. In a read operation, data from data input/output 949 is routed from selected bit lines 941 to sense amplifiers where it is amplified and then passed out through output buffers. In a write operation, data on the data input/output (I/O) 949 passes through input buffers and is written into a memory storage cell in counter array 930 over selected bit lines 941. Address decoders and read/write circuits are known in the art; accordingly a more detailed discussion is not provided.

In this manner, conventional memory cell architectures (e.g., including bit and word lines) and techniques may be used to access the counters (e.g., counters 931 and 932) in array 930. This may allow for a large number of counters to be implemented within an array and accessed (e.g., read, write, set, reset) in an efficient manner without the need to multiplex counters within the array. This also may result in a more densely fabricated array of counters that occupies less area over prior counter array implementations. The efficient data access to and from the memory storage cells enables the array of counters to be written to and read from faster than the multiplexed array of counters. This may be useful for testing the operation of one or more of the counters when the counters are fabricated in an integrated circuit by providing fast and efficient access to the counters and their memory cells.

The counter arrays discussed above in relation to FIGS. 3–9 may be used within a priority memory to insert.policy statements in a memory of a digital signal processor (DSP), as discussed in co-pending Patent application Ser. No. 08/406,170 (the '170 Application), assigned to the same assignee of the present application and herein incorporated by reference.

Figure 10:
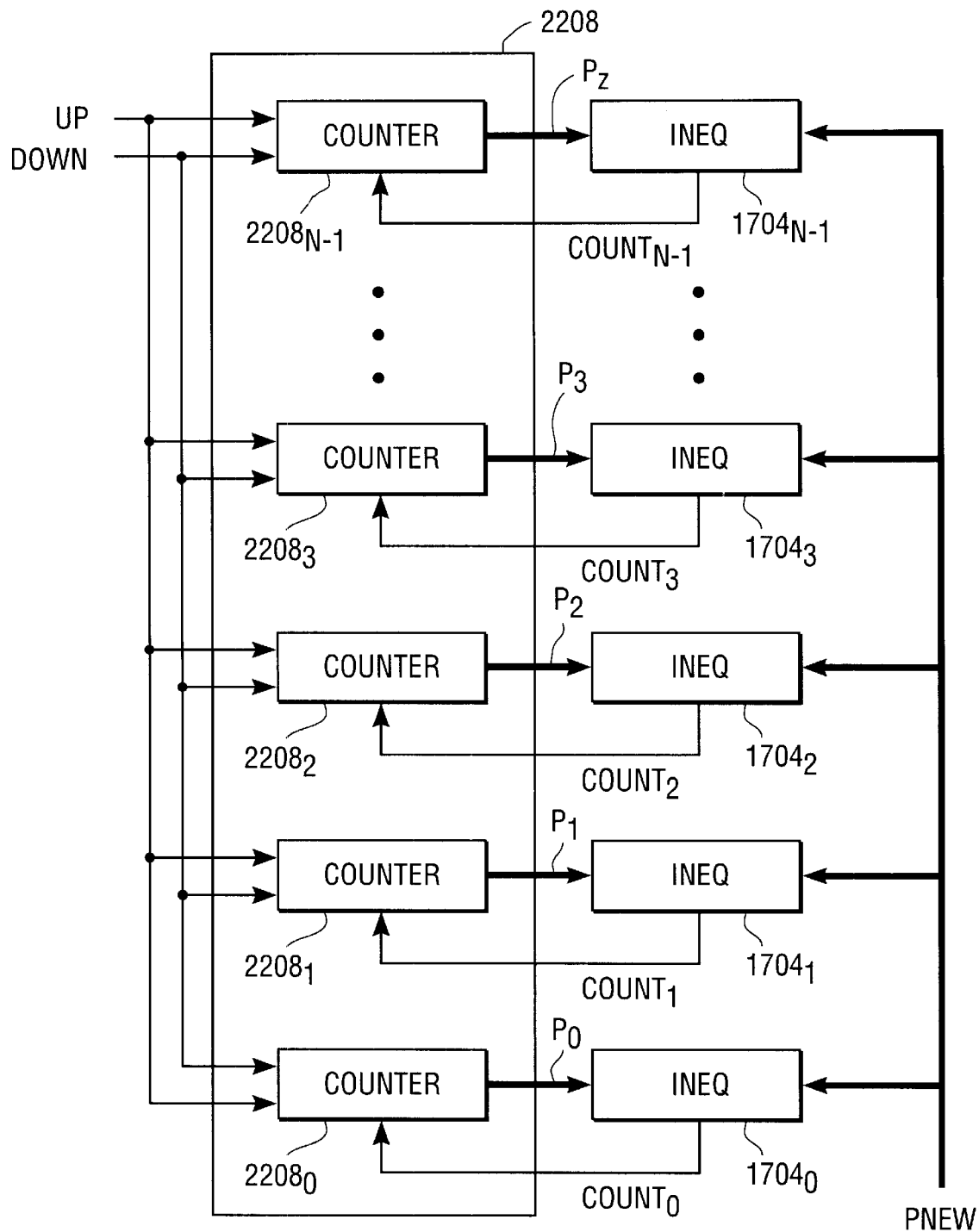
FIG. 10 illustrates one embodiment of a priority memory.

FIG. 10 illustrates one embodiment of a priority memory. Priority memory 2208 includes counters $2208_0$–$2208_{N-1}$ that may be formed from the up-down counter shown in FIG. 8. Each counter corresponds to priority memory location $608_0$–$608_{N-1}$, respectively, (as described in the '170 Application) and stores the priority number for that location. The counters can be loaded (i.e., written to) using write circuits, read from using read circuits, or reset as generally known in the art. Additionally, each counter $2208_0$–$2208_{N-1}$ provides its stored priority number $P_0$–$P_Z$ to a corresponding inequality circuit $1704_0$–$1704_{N-1}$ for comparison with PNEW. When PNEW has a higher priority than the stored priority number for a given location, then the inequality circuit will assert its count signal $COUNT_0$–$COUNT_{N-1}$ such that the corresponding counter is incremented (or, alternatively, decremented). The count signals may gate the CLK signal shown in FIG. 8 to enable/disable the counter(s).

The counter will be incremented if the UP signal is asserted, or will be decremented if the DOWN signal is asserted. The UP and DOWN signals may be generated by an instruction decoder (not shown) on DSP 602 that receives and decodes an insert (write) instruction or a delete (invalidate) instruction to the DSP. For an alternative embodiment, the inequality circuits may each output UP and DOWN signals to their corresponding counters directly in response to one or more signals from the instruction decoder. The counters may be updated synchronously or asynchronously.

Figure 11:
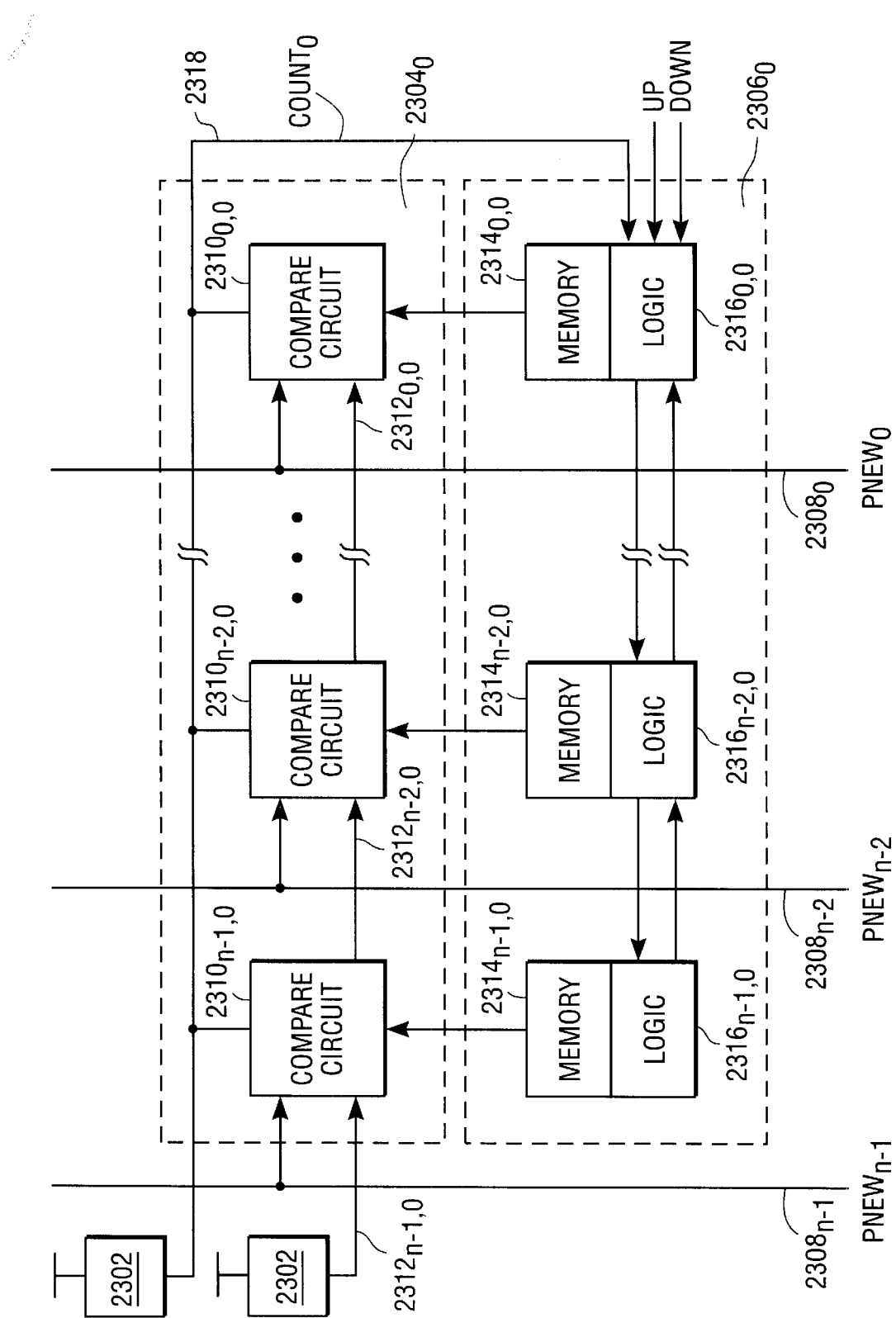
FIG. 11 illustrates one embodiment of an inequality circuit and counter.

Inequality circuits $1704_0$–$1704_{N-1}$ may be disposed external to priority memory 2208, or they may be integrated into the priority memory itself. FIG. 11 shows one embodiment of integrating an inequality circuit with a counter in the priority memory. For this embodiment, inequality circuit $2304_0$ is one embodiment of inequality circuit 17040, and may also be used for any of inequality circuits $1704_1$–$1704_{N-1}$. Counter $2306_0$ is one embodiment of counter $2208_0$, and may also be used for any of counters $2208_1$–$2208_{N-1}$.

As shown in FIG. 11, memory storage elements $2314_{n-1,0}$–$2314_{0,0}$ have associated counter logic circuits $2316_{n-1,0}$–$2316_{0,0}$ to form a conventional counter. Each memory storage element may be a memory cell as a volatile or non-volatile RAM or ROM cell, as discussed above in relation to FIG. 3.

The memory storage elements each store one bit of a priority number such that memory storage element $2314_{n-1,0}$ stores the most significant priority number bit, $2314_{n-1,0}$ stores the most significant priority number bit, and $2314_{0,0}$ stores the least significant number bit. Logic circuits $2316_{n-1,0}$–$2316_{0,0}$ receive the UP, DOWN, and $COUNT_0$ that indicate when the counter should increment, decrement, or leave unchanged the priority number stored in the counter.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
   a counter array having a plurality of counters, each counter having a memory cell;
   an address decoder coupled to the counter array to select at least one of the memory cells within the counter array; and
   read/write circuitry coupled to the counter array to pass data with the counter array.

2. The apparatus of claim 1, wherein at least one of the plurality of counters further comprises:
   a first flop; and
   a second flop coupled to the first flop, each of the first and second flops comprising:
      a master latch having a first memory cell; and
      a slave latch coupled to the master latch, the slave having a second memory cell.

3. The apparatus of claim 2, wherein each of the master and slave latches further comprise control logic circuitry.

4. The apparatus of claim 2, wherein the slave latch further comprises:
   a first transistor coupled to the second memory cell;
   a second transistor coupled to the second memory cell; and
   a third transistor coupled to the first transistor to set the second memory cell and further coupled to the second memory cell to reset the second memory cell.

5. The apparatus of claim 4, wherein the third transistor is coupled to receive a clock signal.

6. The apparatus of claim 4, wherein the memory cell has a bit line and a complement bit line and wherein the first transistor has a first terminal coupled to the bit line and a second terminal coupled to the third transistor, and wherein the second transistor has a first terminal coupled to the complement bit line and a second terminal coupled to the third transistor.

7. The apparatus of claim 6, wherein the first transistor has a gate coupled to receive a reset signal.

8. The apparatus of claim 6, wherein the second transistor has a gate coupled to receive a set signal.

9. The apparatus of claim 1, wherein each counter is a ripple counter.

10. The apparatus of claim 9, wherein the ripple counters are up-counters.

11. The apparatus of claim 9, wherein the ripple counters are down-counters.

12. The apparatus of claim 9, wherein the ripple counters are up/down-counters.

13. The apparatus of claim 1, wherein the memory cell is a static random access memory cell.

14. The apparatus of claim 4, wherein the memory cell is a static random access memory cell.

15. The apparatus of claim 6, wherein the memory cell is a static random access memory cell.

16. The apparatus of claim 1, further comprising:
   bit lines coupled to one of the memory cells of one of the plurality of counters; and
   read/write circuitry coupled to the bit lines.

17. The apparatus of claim 1, further comprising a word line coupled to each of the memory cells of one of the plurality of counters.

18. An apparatus, comprising:
   a counter array having a plurality of counters, each counter of the plurality of counters having a memory cell, each memory cell coupled to a bit line and a complement bit line;
   an address decoder coupled to the counter array to select at least one of the memory cells within the counter array; and
   read/write circuitry coupled to the counter array to pass data with the counter array over the bit lines and the complementary bit lines, and wherein each counter comprises:
      a first flop; and
      a second flop coupled to the first flop, each of the first and second flops comprising:
         a master latch having a first one of the memory cells and a first set/reset circuit; and
         a slave latch coupled to the master latch, the slave latch having a second one of the memory cell and a second set/reset circuit, and wherein each of the master and slave latches comprise:
            a first transistor coupled to the memory cell, the first transistor having a gate coupled to receive a set signal to set the memory cell and a first terminal coupled to the bit line of the memory cell;
            a second transistor coupled to the memory cell, the second transistor having a gate coupled to receive a reset signal to reset the memory cell and a first terminal coupled to the complement bit line of the memory cell; and
            a third transistor coupled to the first and second transistors to enable the memory cell, the first transistor having a second terminal coupled to the third transistor, the second transistor having a second terminal coupled to the third transistor.

19. A counter, comprising:
   a plurality of flip-flops, each of the plurality of flip-flops having first and second latches, each of the first and second latches having a memory cell.

20. The counter of claim 19, wherein the memory cell is a static random access memory cell.

21. The counter of claim 19, wherein the plurality of flip-flops each comprise:
   a first flop having a data output; and
   a second flop having a clock input coupled to the data output of the first flop, and wherein the first latch has an output and the second latch has an output, the second latch coupled to receive the output of the first latch, the first latch having a first logic circuit coupled to a first memory cell and the second latch having a second logic circuit coupled to a second memory cell, and wherein each of the first and second memory cells has a bit line and a complement bit line.

22. The counter of claim 21, wherein the first logic circuit comprises:
   a first transistor coupled to the second memory cell;
   a second transistor coupled to the second memory cell; and
   a third transistor coupled to the first and second transistors to set the second memory cell and further coupled to second memory cell to reset the second memory cell.

23. The counter of claim 22, wherein the third transistor is coupled to receive a clock signal.

24. The counter of claim 21, wherein the memory cell has a bit line and a complement bit line and wherein the first transistor has a first terminal coupled to the bit line and a second terminal coupled to the third transistor, and wherein the second transistor has a first terminal coupled to the complement bit line and a second terminal coupled to the third transistor.

25. The counter of claim 24, wherein the memory cell is a static random access memory cell.

26. The counter of claim 24, wherein the first transistor has a gate coupled to receive a reset signal and the second transistor has a gate coupled to receive a set signal.

27. The counter of claim 24, wherein the first transistor of the first latch is coupled to receive the output of the second latch.

28. The counter of claim 24, wherein the second transistor of the first latch is coupled to receive a complement of the output of the second latch.

29. The counter of claim 24, wherein the output of the second latch of the first flop is coupled to the third transistor of the first latch of the second flop.

30. The counter of claim 21, wherein the first and second latches are coupled together as master-slave latches in a D type flip-flop.

31. The counter of claim 19, wherein each of the plurality of flip-flops has first and second enable inputs and first and second memory cells, the first and second memory cells each having an output, wherein the enable inputs of a first flip-flop are responsive to a clock signal, wherein the enable inputs of a second flip-flop are coupled to receive an output signal from the second memory cell, and wherein each subsequent flip-flop of the plurality of flip-flops has the enable inputs coupled to receive the output signal from the second memory cell of a preceding flip-flop of the plurality of flip-flops.

32. An apparatus, comprising:
first and second flip-flops each having first and second latches, the first and second latches each having a data input, a clock input, and a data output, wherein each of the first and second latches comprises:
a memory cell having a bit line;
first, second, and third transistors each having a gate terminal and first channel terminal and a second channel terminal, the first channel terminals of the first and second transistors coupled to the bit line, the first channel terminal of the third transistor coupled to the second channel terminals of the first and second transistors; and
a first inverter having an input and an output, the output of the first inverter coupled to the gate terminal of the first transistor and the input of the first inverter coupled to the gate terminal of the second transistor, and
wherein the bit line of the memory cell of the first latch is coupled to the input of the first inverter of the second latch, the bit line of the memory cell of the second latch is coupled to an input of a second inverter, an output of the second inverter coupled to the input of the first inverter.

33. The apparatus of claim 32, wherein the memory cell is a static random access memory cell.

34. The apparatus of claim 32, wherein the clock input of the second latch of the first flip-flop is configured to receive a clock signal, the clock input of the first latch of the first flip-flop is configured to receive a complement of the clock signal.

35. The apparatus of claim 34, wherein an output of the second inverter is coupled to the input of the first inverter and wherein the output of the second inverter is coupled to an input of a third inverter, an output of the third inverter coupled to the clock input of the first latch of the second flip-flop and wherein the output of the second inverter is coupled to the clock input of the second latch of the second flip-flop.

36. The apparatus of claim 35, wherein the memory cell is a static random access memory cell.

37. The apparatus of claim 34, wherein an output of the second inverter is coupled to the input of the first inverter and wherein the bit line of the memory cell of the second latch of the first flip-flop is coupled to the input of a third inverter, an output of the third inverter coupled to the clock input of the first latch of the second flip-flop and wherein the output of the second inverter is coupled to the clock input of the second latch of the second flip-flop.

38. The apparatus of claim 37, wherein the memory cell is a static random access memory cell.

39. The apparatus of claim 34, further comprising an output multiplexer having a control input, a first data input coupled to the bit line of the memory cell of the first latch, a second data input coupled to the output of the second inverter, an output coupled an input of a third inverter, an output of the third inverter coupled to the clock input of the first latch of the second flip-flop, the output of the output multiplexer coupled to the clock input of the second latch of the second flip-flop, wherein the control input of the output multiplexer selects between the first and second data inputs of the output multiplexer,
and wherein each flip-flop further comprises a feedback multiplexer having a control input, a first data input coupled to the bit line of the memory cell of the first latch, a second data input coupled to the output of the second inverter, an output coupled to the input of the first inverter, and wherein the control input of the feedback multiplexer selects between the first and second data inputs of the feedback multiplexer.

40. The apparatus of claim 39, wherein the memory cell is a static random access memory cell.

41. A method, comprising:
receiving a data value at an input to a first logic circuit;
storing the data value in a first memory cell;
providing the data value to a second memory cell coupled to the first memory cell through a second logic circuit;
outputting the data value from the second memory cell; and
feeding back one of the output data value from the second memory cell and an
inverted output data value from the second memory cell to the input of the first logic circuit.

42. The method of claim 41, further comprising:
providing a clock signal to the second logic circuit;
providing a complement of the clock signal to the first logic circuit; and
changing the data value on the rising edge of the clock signal.

43. The method of claim 41, further comprising:
inverting the output data value from the second memory cell; and
providing the inverted output data value from the second memory cell as a clock input to a third logic circuit.

44. The method of claim 41, further comprising:

providing the output data value from the second memory cell as a clock input to a third logic circuit; and inverting the output data value from the second memory cell.

45. The method of claim 41, further comprising:

inverting the output data value from the second memory cell; and selecting between the output data value and the inverted output data value from the second memory cell to generate a selected output.

46. The method of claim 45, further comprising providing the selected output as a clock input to a third logic circuit.

47. The method of claim 41, wherein the first and second memory cells are in a preceding flip-flop of a plurality of flip-flops and wherein the method further comprises:

inverting the data value output from the second memory cell of the preceding flip-flop;

providing the inverted data value to a subsequent flip-flop and to the first memory cell of the preceding flip-flop; and providing the inverted data value to an enable input of the subsequent flip-flop.

48. The method of claim 41, wherein the first and second memory cells are in a preceding flip-flop of a plurality of flip-flops and wherein the method further comprises:

inverting the data value output from the second memory cell of the preceding flip-flop;

providing the inverted data value to a subsequent flip-flop and to the first memory cell of the preceding flip-flop; and providing the data value to an enable input of the subsequent flip-flop.

49. The method of claim 41, wherein the first and second memory cells are in a preceding flip-flop of a plurality of flip-flops and wherein the method further comprises:

selecting between the data value and the inverted data value of the preceding flip-flop;

selecting between the data value and the inverted data value of the subsequent flip-flop;

providing the selected one of the data value and the inverted data value of the preceding flip-flop to the first memory cell of the preceding flip-flop at a first clock cycle;

providing the selected one of the data value and the inverted data value of the subsequent flip-flop to the first memory cell of the subsequent flip-flop at the first clock cycle; and applying the selected one of the data value and the inverted data value of the preceding flip-flop to an enable input of the subsequent flip-flop at least one clock cycle after the first clock cycle.

50. An apparatus, comprising:

means for storing data in a counter using a first memory cell; and means for storing the data in the counter using a second memory cell.

51. The apparatus of claim 50, wherein the first memory cell is a static random access memory cell.

52. The apparatus of claim 50, further comprising means for incrementing the counter.

53. The apparatus of claim 50, further comprising means for decrementing the counter.

54. The apparatus of claim 53, wherein the means for decrementing comprise:

means for providing the inverted data value to the first memory cell of the preceding flip-flop; and means for providing the data value from the second memory cell of the preceding flip-flop to an enable input of the subsequent flip-flop.

55. The apparatus of claim 50, further comprising means for incrementing and decrementing the counter.

56. The apparatus of claim 50, further comprising:

means for resetting the data to a first logic state; and means for setting the data to a second logic state.

* * * * *